United States Patent
Strittmatter et al.

(10) Patent No.: US 9,225,145 B2
(45) Date of Patent: Dec. 29, 2015

(54) ELECTRO-OPTICAL COMPONENT

(75) Inventors: André Strittmatter, Berlin (DE); Jan-Hindrik Schulze, Berlin (DE); Tim David Germann, Berlin (DE)

(73) Assignee: Technische Universität Berlin, Berlin (DE)

( * ) Notice: Subject to any disclaimer, the term of this patent is extended or adjusted under 35 U.S.C. 154(b) by 0 days.

(21) Appl. No.: 14/127,679

(22) PCT Filed: Jun. 21, 2012

(86) PCT No.: PCT/DE2012/200044
§ 371 (c)(1),
(2), (4) Date: Dec. 19, 2013

(87) PCT Pub. No.: WO2013/000460
PCT Pub. Date: Jan. 3, 2013

(65) Prior Publication Data
US 2014/0126597 A1    May 8, 2014

(30) Foreign Application Priority Data

Jun. 28, 2011  (DE) .......................... 10 2011 078 176

(51) Int. Cl.
*H01L 21/20* (2006.01)
*H01L 21/36* (2006.01)
(Continued)

(52) U.S. Cl.
CPC .................. *H01S 5/183* (2013.01); *B82Y 20/00* (2013.01); *H01S 5/18311* (2013.01);
(Continued)

(58) Field of Classification Search
CPC .............. G02B 6/4214; H01S 5/18311; H01S 5/18341; H01S 5/18358; H01S 5/3215

USPC ......... 327/44.01, 45.011; 438/22, 44; 372/46, 372/96; 257/18, 103
See application file for complete search history.

(56) References Cited

U.S. PATENT DOCUMENTS

2002/0006144 A1  1/2002  Kobayashi
2002/0097764 A1*  7/2002  Jewell ............................ 372/46
(Continued)

FOREIGN PATENT DOCUMENTS

EP           1 302 810 A2    4/2003
JP           2008-177615     7/2008
WO       WO 2007/062625     6/2007

OTHER PUBLICATIONS

International Search Report and Written Opinion; PCT/DE2012/200044; Nov. 26, 2012; 16 pages.

(Continued)

*Primary Examiner* — Kimberly Rizkallah
*Assistant Examiner* — Brian Turner
(74) *Attorney, Agent, or Firm* — Gordon & Rees, LLP

(57) ABSTRACT

The invention relates, inter alia, to a method for producing an electro-optical component (10, 200) suitable for emitting electromagnetic radiation (120), wherein in the method
  a first intermediate layer (60) is applied on a carrier,
  a second intermediate layer (70) is applied on the first intermediate layer, and
  after the second intermediate layer has been applied, the buried first intermediate layer is locally modified,
  wherein as a result of the local modification of the buried first intermediate layer in a lateral direction a refractive index jump is produced which brings about a lateral wave guiding of the electromagnetic radiation (120) in the unmodified region of the first intermediate layer.

13 Claims, 9 Drawing Sheets

Figure 1:
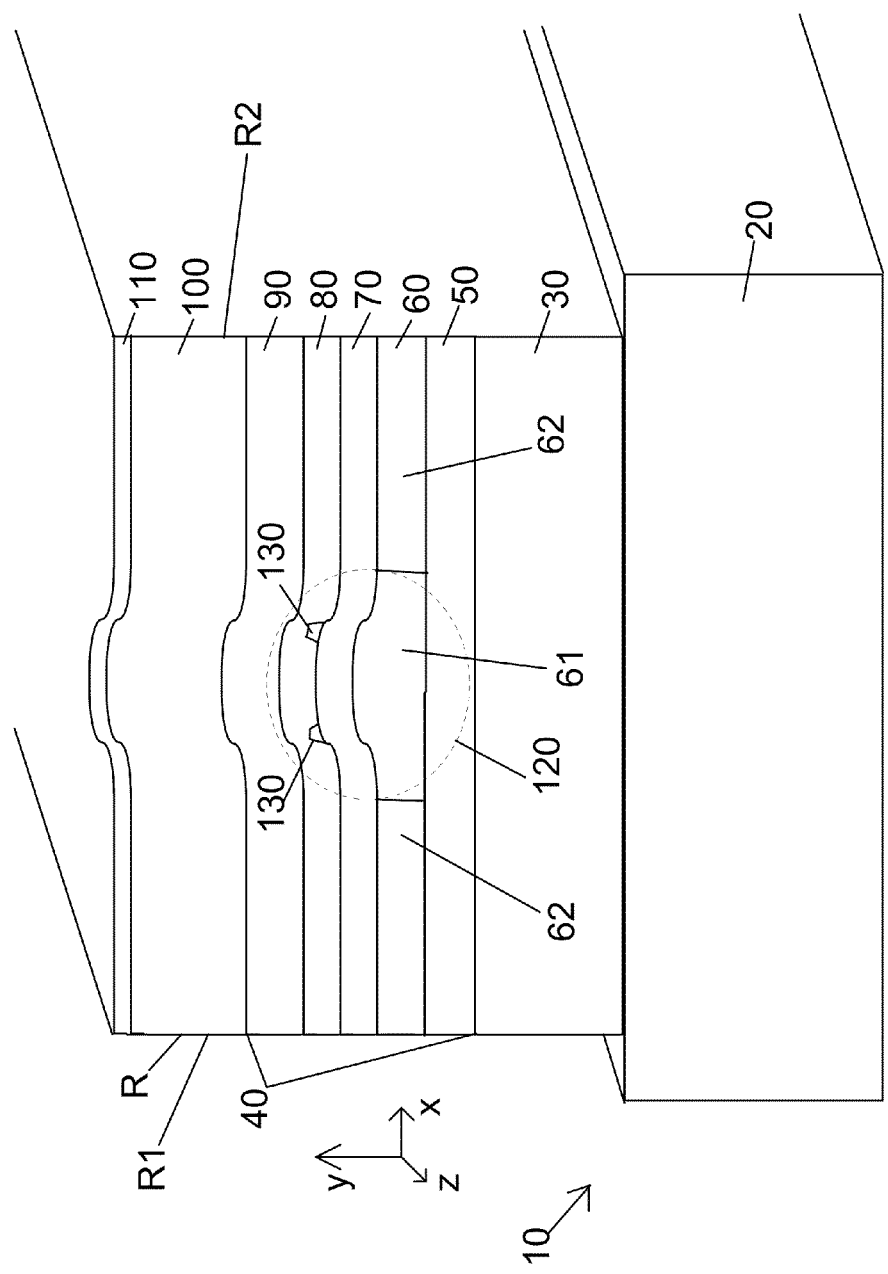

(51) Int. Cl.
*H01S 5/00* (2006.01)
*H01S 5/34* (2006.01)
*H04B 10/00* (2013.01)
*H01S 5/183* (2006.01)
*H01S 5/227* (2006.01)
*H01S 5/32* (2006.01)
*B82Y 20/00* (2011.01)
*H01S 5/20* (2006.01)
*H01S 5/22* (2006.01)
*H01L 21/02* (2006.01)
*H01L 33/00* (2010.01)

(52) U.S. Cl.
CPC .............. *H01S 5/227* (2013.01); *H01S 5/3201* (2013.01); *H01S 5/341* (2013.01); *H01L 21/0262* (2013.01); *H01L 21/02463* (2013.01); *H01L 21/02505* (2013.01); *H01L 21/02546* (2013.01); *H01L 33/0062* (2013.01); *H01L 2924/0002* (2013.01); *H01S 5/18325* (2013.01); *H01S 5/204* (2013.01); *H01S 5/2031* (2013.01); *H01S 5/222* (2013.01); *H01S 5/2215* (2013.01); *H01S 5/3403* (2013.01); *H01S 2304/04* (2013.01)

(56) References Cited

U.S. PATENT DOCUMENTS

| | | | |
|---|---|---|---|
| 2003/0066997 | A1 | 4/2003 | Akiyama |
| 2004/0095978 | A1* | 5/2004 | Cheng et al. ................... 372/45 |
| 2005/0271105 | A1 | 12/2005 | Kuromizu |
| 2008/0212633 | A1* | 9/2008 | Shimizu et al. .......... 372/45.011 |
| 2008/0259980 | A1 | 10/2008 | Wierer et al. |
| 2009/0268773 | A1* | 10/2009 | Iwai et al. ................ 372/50.124 |
| 2010/0006143 | A1* | 1/2010 | Welser .......................... 136/255 |
| 2010/0074293 | A1 | 3/2010 | Lochmann et al. |

OTHER PUBLICATIONS

Yong Cheng et al.; "Lasting Characteristics of High-Performance Narrow-Stripe InGaAs—GaAs Quantum-Well Lasers Confined by AlAs Native Oxide", IEEE Photonics Technology Letters, vol. 8, No. 2, Feb. 1996; pp. 176-178.

H. Lee et al.; "Controlled ordering and positioning of InAs self-assembled quantum dots", Materials Department, University of California, Santa Barbara, California, 2000, XP-002183028; pp. 2193-2196.

* cited by examiner

ELECTRO-OPTICAL COMPONENT

The invention relates to a method for producing an electro-optical component suitable for emitting electromagnetic radiation.

A method of this type is known from the International Patent Application WO 2007/062625. In the previously known method, lateral flanks are etched. In addition, a current aperture is formed which defines the electrically excited volume during operation.

The invention is based on the object of specifying a method with which even better properties can be achieved for the electro-optical component.

This object is achieved according to the invention by means of a method comprising the features as claimed in patent claim 1. Advantageous configurations of the method according to the invention are specified in dependent claims.

Accordingly, it is provided according to the invention that a first intermediate layer is applied on a carrier, a second intermediate layer is applied on the first intermediate layer, and, after the second intermediate layer has been applied, the buried first intermediate layer is locally modified, wherein as a result of the local modification of the buried first intermediate layer in a lateral direction a refractive index jump is produced which brings about a lateral wave guiding of the electromagnetic radiation in the unmodified region of the first intermediate layer.

One essential advantage of the method according to the invention is that in the context of the local modification of the buried first intermediate layer in a lateral direction a wave guiding is produced. What can be achieved by this lateral wave guiding is that the electro-optical radiation is guided primarily or exclusively in the inner region of the component and in particular cannot (or at least cannot significantly) pass into the region of outer, for example etched, edges, and so the attenuation of the electro-optical radiation is minimized.

A further essential advantage of the method according to the invention is that as a result of the local modification of the buried first intermediate layer, besides the wave guiding already discussed, at the same time it is also possible to achieve a current focusing in that region of the component in which the first intermediate layer guides the electro-optical radiation. Consequently, in an advantageous manner, by way of example, both a lateral waveguiding and an electric current aperture can be produced as a result of the step of local modification.

Preferably, the local modification of the first intermediate layer causes a strain both in the first intermediate layer and in the second intermediate layer situated thereabove and forms an elevation above an inner semiconductor region of the first intermediate layer.

Preferably, a third intermediate layer is applied on the second intermediate layer, wherein nanostructures are formed on the second intermediate layer as a result of the strain in the first and second intermediate layers.

In one preferred configuration of the method, the nanostructures are formed in the region of the outer edges of the elevation on the second intermediate layer, to be precise on account of the strain caused previously in the region of the outer edges of the elevation.

In order to produce the strain in the region of the outer edges of the elevation, which strain is advantageous for forming the nanostructures, it is regarded as advantageous if the lateral diameter of the elevation - measured in the plane of the first intermediate layer is greater than 1.5 µm. Preferably, the diameter lies in the range of between 1.5 µm and 2.5 µm.

Alternatively, the nanostructures can be formed on the second intermediate layer on account of the strain in the central region of the elevation. In order to produce the strain in the central region of the elevation, which strain is advantageous for forming the nanostructures, it is regarded as advantageous if the lateral diameter of the elevation—measured in the plane of the first intermediate layer—is a maximum of 1.5 µm.

The third intermediate layer preferably forms the active zone of the component in which radiation is generated.

Preferably, quantum dots or quantum films are formed as nanostructures.

It is regarded as particularly advantageous if as a result of the local modification of the buried first intermediate layer in a lateral direction a refractive index jump is produced symmetrically about an optical axis (e.g. an axis of symmetry) of the component, as a result of which the lateral waveguiding is effected symmetrically with respect to the optical axis. In this configuration, the local modification of the buried first intermediate layer can therefore cause an optical centering of the optical component about a predefined optical axis, for example an axis of symmetry of the component.

Preferably, a third intermediate layer is grown epitaxially on the second intermediate layer after the local modification of the first intermediate layer. This configuration of the method makes it possible for the third intermediate layer to remain unaffected by the step of local modification of the first intermediate layer, and in particular not to be altered or impaired by or during the modification of the first intermediate layer.

It is furthermore regarded as particularly advantageous if as a result of the local modification of the buried first intermediate layer at least one section of the second intermediate layer situated thereabove is locally mechanically strained and at least one material parameter of the third intermediate layer is location-dependent on account of the local strain in the second intermediate layer (for example symmetrically about the optical axis of the component). In this configuration, the local modification of the first intermediate layer not only achieves a lateral waveguiding but furthermore also influences the material properties of the third intermediate layer situated thereabove. In this regard, a local strain can cause or support for example the formation of nanostructures (e.g. quantum wires, quantum dots or quantum films (in the jargon also called "quantum wells")) in the third intermediate layer.

Preferably, on account of the location dependence of one or more material parameters of the third intermediate layer, one or more local minima are produced in the electronic transitions of the third intermediate layer. The minimum or the minima of the electronic transitions is/are preferably arranged symmetrically about the optical axis of the component.

In connection with the modification of the first intermediate layer, it is regarded as advantageous if a section of the second intermediate layer is removed and the buried first intermediate layer is exposed in sections and the intermediate layer exposed in sections is chemically modified before the third intermediate layer is grown epitaxially on the second intermediate layer. The modification of the first intermediate layer in sections can be effected for example by oxidation or nitration (nitriding).

It is additionally regarded as advantageous if the chemically modified section of the first intermediate layer is electrically nonconductive or only poorly conductive and has a lower refractive index than the unmodified section of the buried first intermediate layer. In this method variant, both an electric current aperture and a lateral waveguiding can be constrained in a single method step.

The electro-optical component can be laterally monomodal or laterally multimodal with regard to the emitted electromagnetic radiation. The lateral mode or the lateral modes of the electromagnetic radiation is/are preferably defined by the lateral waveguiding of the unmodified region of the buried first intermediate layer.

Preferably, the thickness of the buried first intermediate layer and the lateral dimension of the unmodified section of the buried first intermediate layer are chosen in such a way that the lateral mode or the lateral modes of the electromagnetic radiation is/are defined by the unmodified region of the buried first intermediate layer.

Preferably, the electromagnetic radiation is generated exclusively, at least approximately exclusively, in that region of the third intermediate layer which is situated above the unmodified section of the first intermediate layer. In this configuration, a particularly large overlap occurs between the lateral wave guiding in the first intermediate layer and the optical emission (or photon generation) in the third intermediate layer. In this case, the local generation of the electromagnetic radiation in the region above the strained section of the second intermediate layer is preferably effected by a parameter change within the third intermediate layer on account of the strain in the second intermediate layer.

Preferably, a mechanical strain is locally induced in the second intermediate layer and the third intermediate layer as a result of the local modification of the first intermediate layer, said mechanical strain supporting or causing the formation of nanostructures during the deposition of the third intermediate layer.

The invention furthermore relates to an electro-optical component suitable for emitting electromagnetic radiation.

With regard to such an electro-optical component, according to the invention it is provided that said electro-optical component is equipped with a buried, locally modified first intermediate layer, in which as a result of the local modification in a lateral direction a refractive index jump is produced which brings about a lateral waveguiding of the electromagnetic radiation in the unmodified region of the first intermediate layer.

With regard to the advantages of the electro-optical component according to the invention, reference should be made to the above explanations in connection with the method according to the invention, since the advantages of the method according to the invention substantially correspond to those of the electro-optical component.

In accordance with one preferred configuration of the component, it is provided that the thickness of the buried first intermediate layer and the lateral dimension(s) of the unmodified section of the buried first intermediate layer are chosen in such a way that the lateral mode or the lateral modes of the electromagnetic radiation is/are guided by the unmodified region of the buried intermediate layer, a second intermediate layer is grown on the locally modified first intermediate layer and is locally strained as a result of the modification of the buried first intermediate layer, a third intermediate layer is grown epitaxially on the locally strained second intermediate layer, in which third intermediate layer at least one material parameter is location-dependent on account of the local strain in the second intermediate layer, and the electromagnetic radiation is generated exclusively or preferably in that region of the third intermediate layer which is situated above the strained section of the second intermediate layer.

The optical axis of the electro-optical component can be, for example, perpendicular to the surface of the substrate. Such a configuration is a "vertically emitting" optical component.

Alternatively, the optical axis can also run parallel to the surface of the carrier (or substrate): in such a configuration, the component can be an edge emitting component, for example. In order to achieve a waveguiding along the surface of the substrate, a ridge waveguide can be produced, for example, the longitudinal axis of which runs parallel to the carrier surface and/or parallel to the optical axis of the optoelectronic component.

Preferably, the substrate of the electro-optical component is a gallium arsenide substrate.

Figure 6:
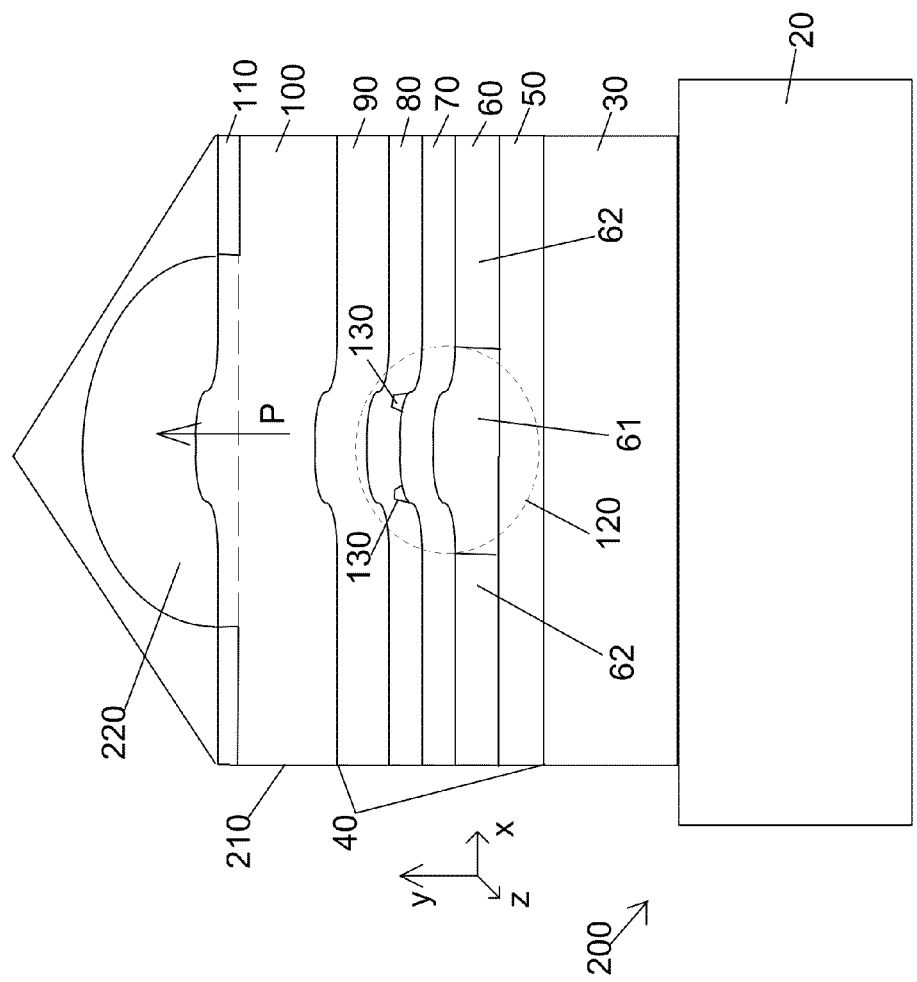
Figure 7:
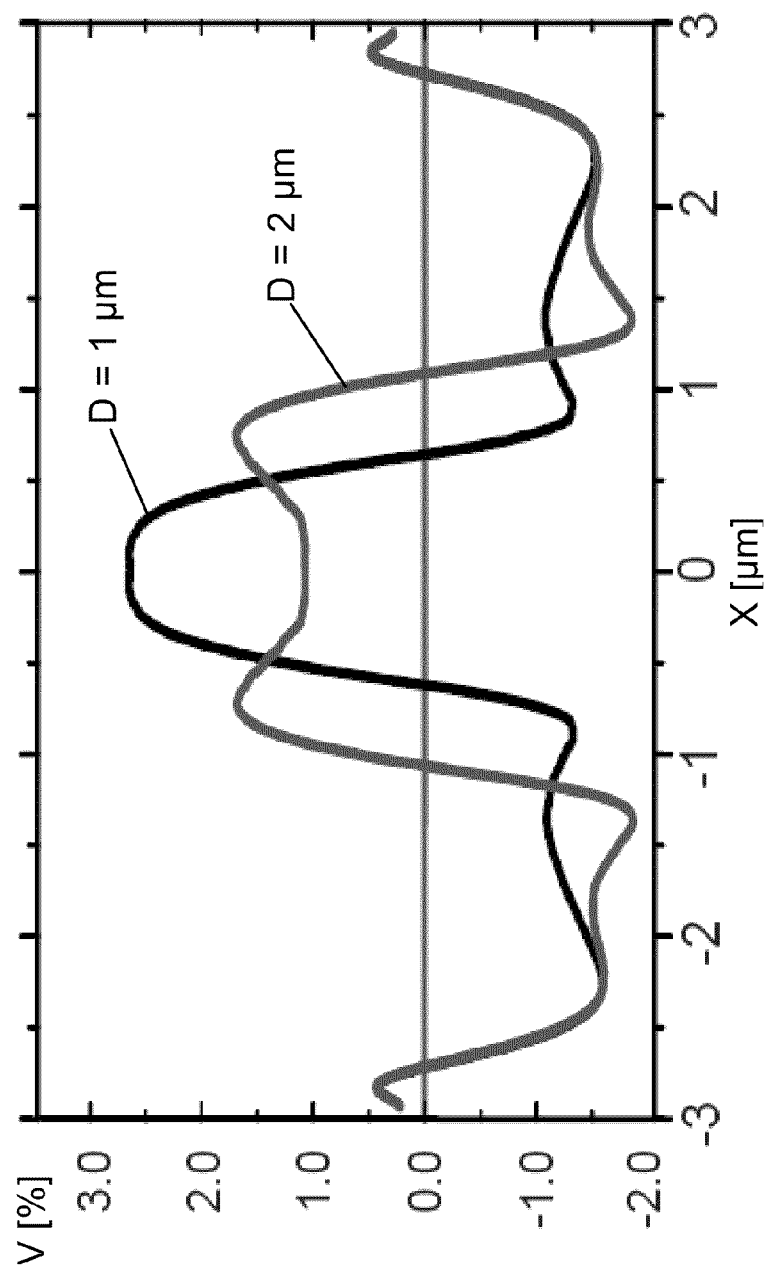
Figure 8:
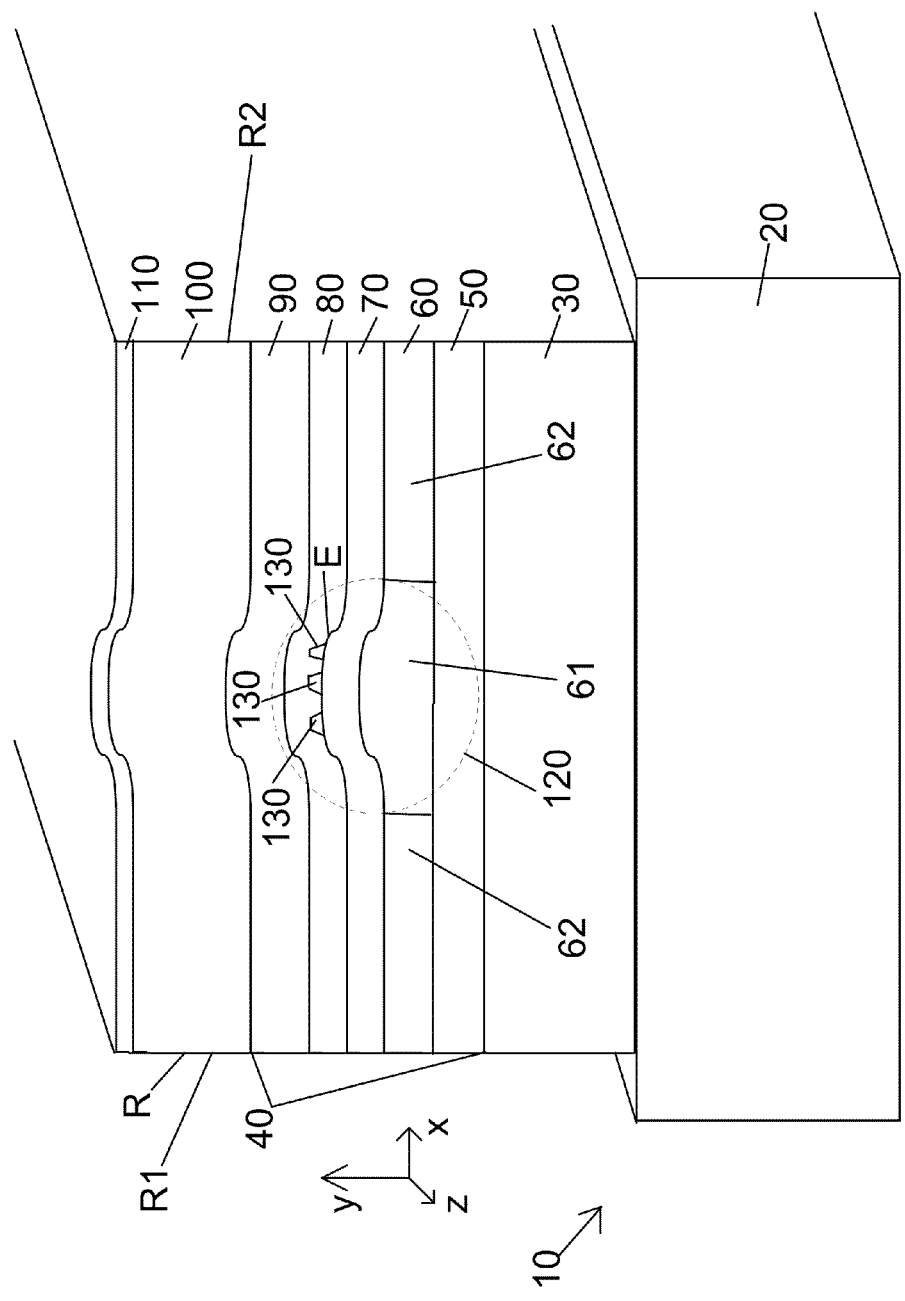
Figure 9:
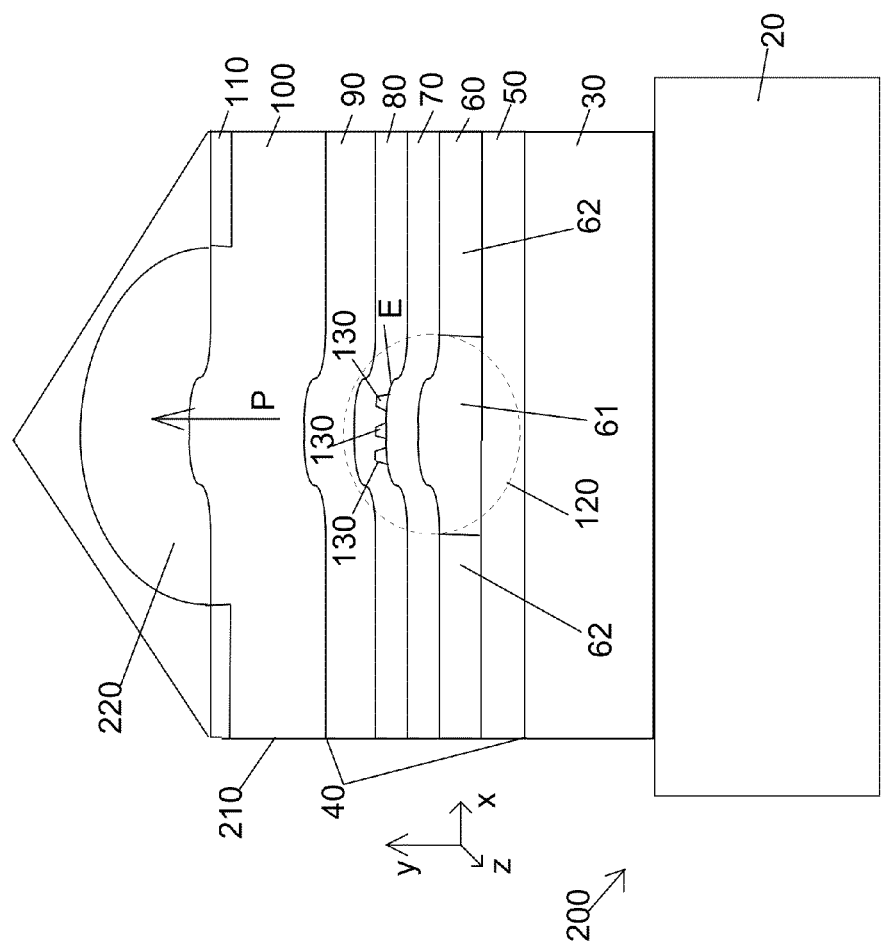

The invention is explained in greater detail below on the basis of exemplary embodiments; in this case in the figures, by way of example:

FIG. 1 shows an exemplary embodiment of an edge emitting electro-optical component according to the invention, FIGS. 2-5 show production steps by which the component in accordance with FIG. 1 can be produced, FIG. 6 shows an exemplary embodiment of a vertically emitting electro-optical component, FIG. 7 shows by way of example the profile of the strain against the elevation for two different diameters of the elevation, FIG. 8 shows an exemplary embodiment of an edge emitting electro-optical component in which the diameter of the elevation is chosen in such a way that nanostructures are formed in the central region of the elevation, and FIG. 9 shows an exemplary embodiment of a vertically emitting electro-optical component in which the diameter of the elevation is chosen in such a way that nanostructures are formed in the central region of the elevation.

In the figures, the same reference signs are always used for identical or comparable components, for the sake of clarity.

FIG. 1 reveals an electro-optical component 10, which is a laser, for example.

The component 10 comprises a substrate 20, on which a lower waveguide cladding layer 30 is arranged. A waveguide core 40 is situated on said lower waveguide cladding layer 30, said waveguide core comprising a lower waveguide core layer 50, a first intermediate layer 60, a second intermediate layer 70, a third intermediate layer 80 and an upper waveguide core layer 90.

The substrate 20, the lower waveguide cladding layer 30 and the lower waveguide core layer 50 form a carrier, on which the first intermediate layer 60 has been applied.

The third intermediate layer 80 forms an active layer in which electromagnetic radiation is generated during the operation of the component 10.

An upper waveguide cladding layer 100 is situated above the waveguide core 40, an upper contact layer 110 being applied on said upper waveguide cladding layer.

The substrate 20 and the layers 30, 50, 60 (partly), 70, 80, 90 and 100 preferably consist of semiconducting material. The upper contact layer 110 can consist for example of a highly doped semiconductor material or of metal.

The doping of the substrate 20 and of the layers 30, 50 and 60 can be inverse for example with respect to the doping of the layers 90 and 100, in order to form a pn diode structure with which charge carriers can be injected into the active third intermediate layer 80.

The refractive index of the layers 50, 70, 80 and 90 of the waveguide core 40 is greater than that of the waveguide cladding layers 30 and 100, in order to achieve a waveguiding in a vertical direction. Examples of suitable material combinations for the layers 30 to 100 are explained further below.

The component 10 in accordance with FIG. 1 is an edge emitting component. For this purpose, the component 10 has a ridge R extending along the z-direction. The electromagnetic radiation is emitted in the z-direction (or counter to the z-direction) at one of the two (or at both) end faces of the ridge R.

The component 10 in accordance with FIG. 1 can be operated as follows:

If an electrical voltage is applied to the upper contact layer 110 and to the substrate 20, a current flow through the waveguide core 40 occurs. On account of this current flow, photons are generated in the third intermediate layer 80 and lead to an electromagnetic radiation along the z-direction of the component 10. The wave propagation of the electromagnetic radiation is identified by an ellipse bearing the reference sign 120 in FIG. 1, which indicates the fundamental mode of the radiation generated by the component 10. The fundamental mode extends along the ridge longitudinal direction along the z-direction out of the plane of the drawing.

The lateral waveguiding in the waveguide core 40 is caused by a refractive index jump in the first intermediate layer 60. It can be discerned in FIG. 1 that the first intermediate layer 60 comprises a non-oxidized inner semiconductor region 61 and an oxidized outer region 62. The refractive index of the inner semiconductor region 61 lies in the customary refractive index range for semiconductor materials of between 2 and 4, for example being approximately 3.5. The refractive index in the outer oxidized region 62 lies within the customary refractive index range for oxide materials of between 1 and 2, in other words for example being approximately 1.5. The very large difference in refractive indices between the inner semiconductor region 61 and the outer region 62 results in a waveguiding in a lateral direction, such that the electromagnetic radiation is guided exclusively, at least approximately exclusively, laterally in the inner semiconductor region 61. Consequently, the electromagnetic radiation does not (or at least does not significantly) come into contact with the edges R1 and R2 delimiting the ridge R toward the outside.

The two different regions 61 and 62 in the intermediate layer 60 furthermore result in a current focusing (current aperture) in the inner semiconductor region 61, specifically since the current flowing between the upper contact layer 110 and the substrate 20 has to flow through the inner semiconductor region 61 since the outer region 62 is oxidized and therefore nonconductive.

In order to generate the electromagnetic radiation in the exemplary embodiment in accordance with FIG. 1, preferably nanostructures 130 (for example quantum wires, quantum dots or quantum films) are arranged in the active third intermediate layer in the region above the inner semiconductor region 61 of the first intermediate layer 60, said nanostructures being excited in the case of a current flow and generating the electromagnetic radiation of the component. In this case, the arrangement of the nanostructures 130 is chosen in such a way that they are arranged substantially, preferably exclusively, above the inner semiconductor region 61 of the first intermediate layer 60 or have locally modified properties there. In the case of such an arrangement of the nanostructures 130, a particularly high efficiency of the component is achieved since the entire current flowing through the component 10 preferably has to pass the nanostructures 130 on account of the current guiding through the inner semiconductor region 61.

An exemplary embodiment of a method for producing the component 10 will now be explained in greater detail in association with FIGS. 2 to 6.

Figure 2:
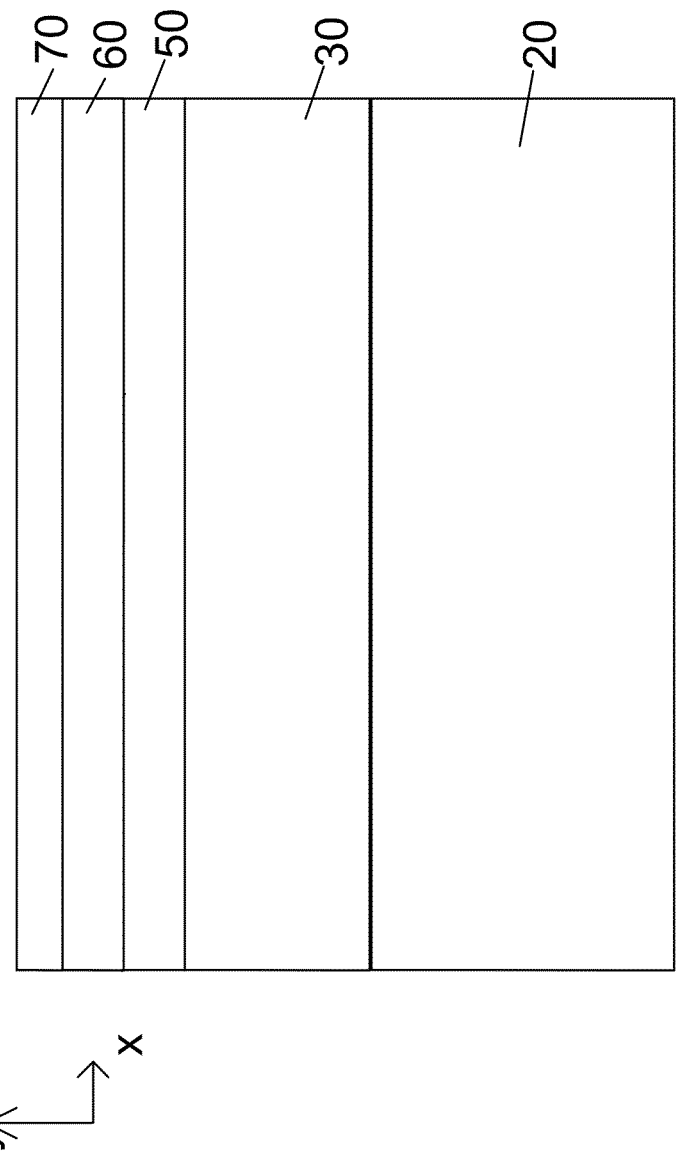
Figure 3:
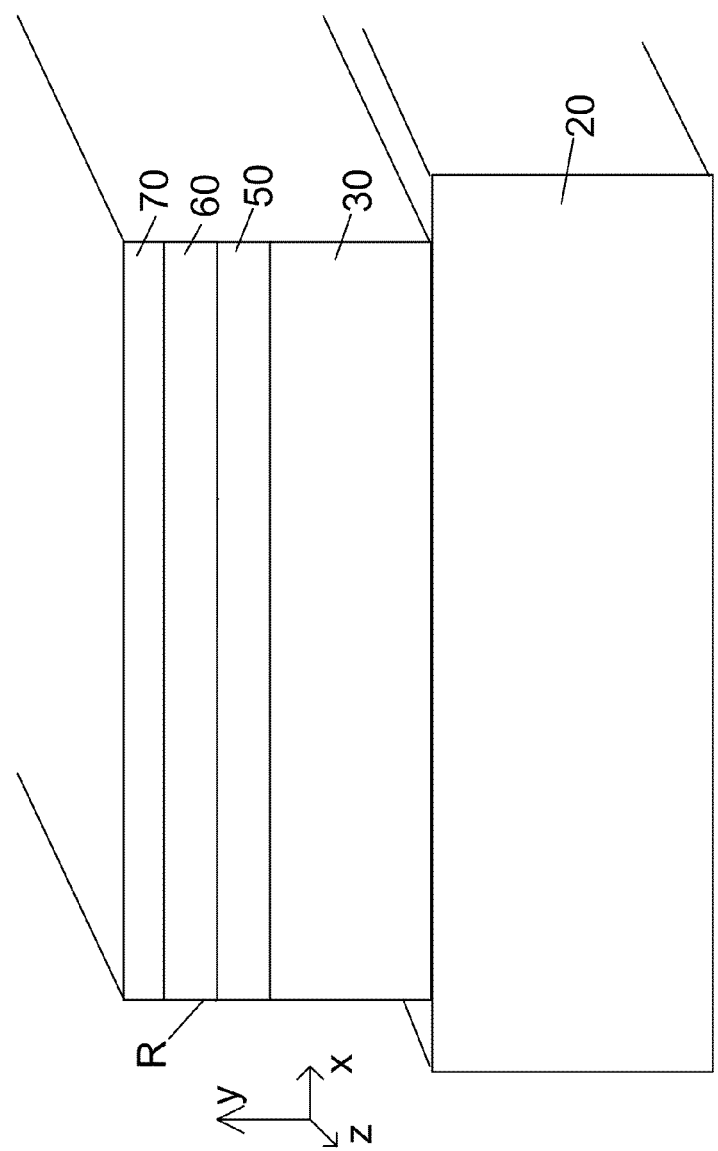

FIG. 2 reveals the substrate 20, on which the lower waveguide cladding layer 30 and the lower waveguide core layer 50 have been applied. The substrate 20 and the layers 30 and 50 form a carrier for applying the first intermediate layer 60, to which the second intermediate layer 70 is subsequently applied.

The layers 30, 50, 60 and 70 mentioned may have been grown onto the substrate 20 epitaxially, for example.

After the layers 30, 50, 60 and 70 have been applied, a ridge R having a width of 5-100 µm, preferably 25 µm, is etched into the structure, the longitudinal direction of said ridge extending along the z-direction. The etching depth of the ridge is chosen such that the latter is significantly greater than the total thickness of the layers 90, 100 and if appropriate 110 applied epitaxially in further production steps, preferably greater than 1 µm. The ridge structure is shown by way of example in FIG. 3. The first intermediate layer 60 is exposed laterally as a result of the etching step.

Figure 4:
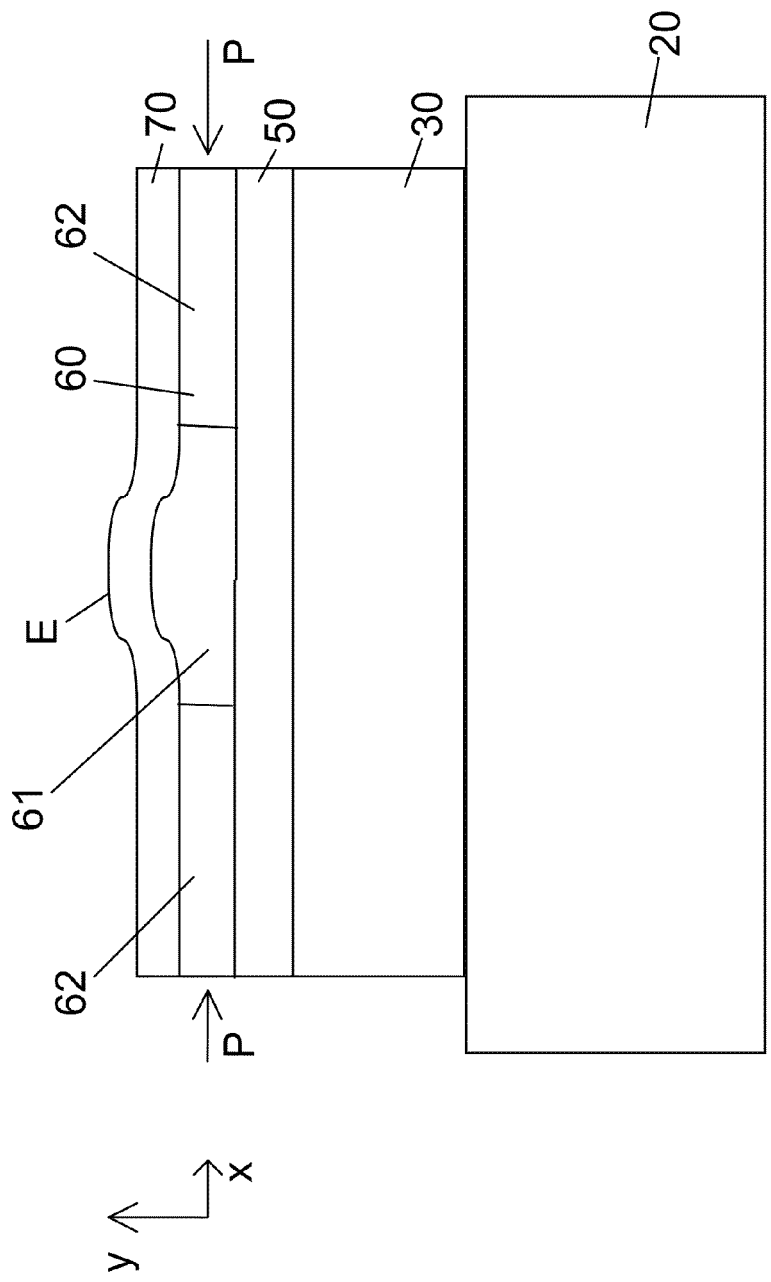
Figure 5:
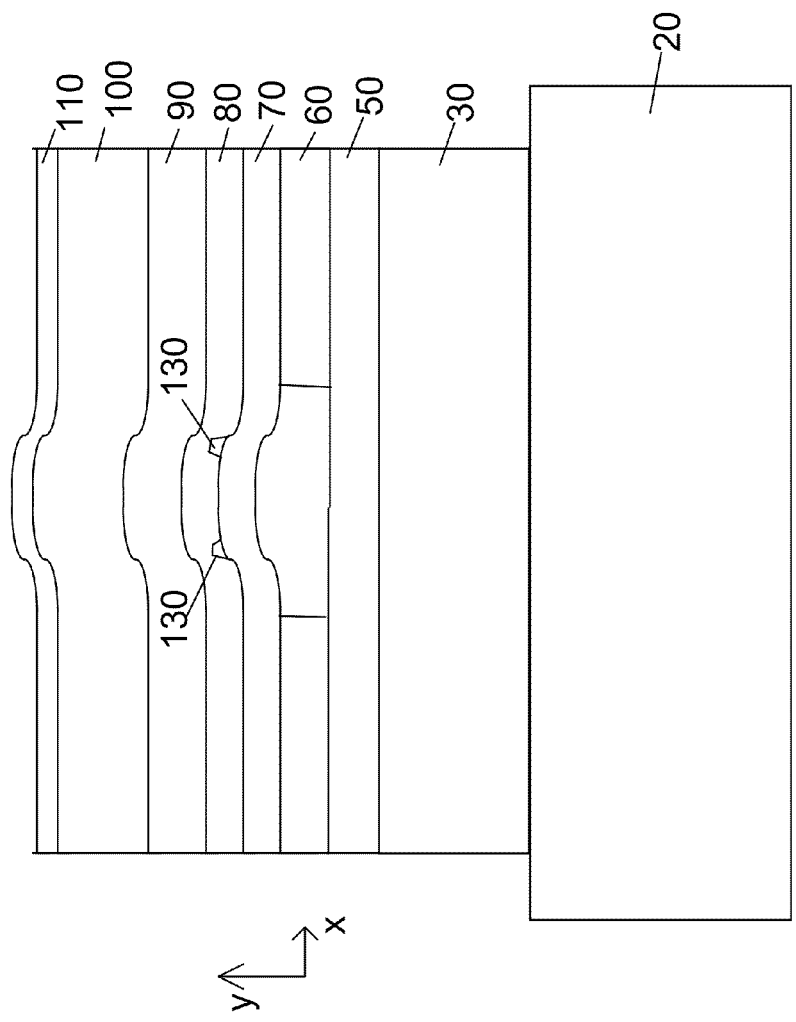

After the etching of the ridge structure R, the first intermediate layer 60 is oxidized from outside, as shown by arrows P in FIG. 4. As a result of the oxidation of the first intermediate layer 60, the outer oxidized layer regions 62 are formed, which enclose the non-oxidized inner semiconductor region 61 of the first intermediate layer 60.

The materials of the layers 30, 50 and 70 are preferably composed of a different material than the first intermediate layer 60, such that exclusively or at least primarily an oxidation of the first intermediate layer 60 is effected during the oxidation. By way of example, the material of the layer 30 can be AlGaAs or InGaP semiconductors, the material of the layers 50 and 70 can be AlGaAs or GaAs semiconductors and the material of the first intermediate layer 60 can be AlGaAs semiconductors. The Al content of the intermediate layer 60 is chosen in the growth direction at least in sections as >80%, but preferably as 100%, in order to ensure an efficient oxidation.

An automatic centering of the inner semiconductor region 61 relative to the two edges R1 and R2 of the ridge R occurs during the oxidation step. What is achieved by this automatic alignment is that the fundamental mode 120 (cf. FIG. 1) of the electromagnetic radiation will be guided centrally between the edges R1 and R2 of the ridge R. An axis of symmetry of the component 10 along the z-axis is thus formed in a self-aligning manner.

FIG. 4 furthermore reveals that a strain both of the first intermediate layer 60 and of the second intermediate layer 70 situated thereabove occurs on account of the step of oxidation of the first intermediate layer 60. A slight elevation E having a height of preferably 1 to 10 nm arises in the region above the inner semiconductor region 61 of the first intermediate layer 60 when the abovementioned materials are used.

In the context of further production steps (cf. FIG. 5), the third intermediate layer 80 and the further layers 90, 100 and 110 are applied to the second intermediate layer 70 strained in this way. By means of a suitable material selection and process control when applying the third intermediate layer 80, what can be achieved is that the nanostructures 130 are formed in the region of the elevation E, in particular in the region of the outer edges of the elevation E. The formation of the nanostructures 130, with an achievable lateral accuracy of ±50 nm to ±1 µm, is based on the mechanical strain within the second intermediate layer 70, caused by the oxidation of the first intermediate layer 60.

In other words, the step of oxidation of the first intermediate layer 60 achieves not only a lateral waveguiding for the electromagnetic radiation, but furthermore also an automatic alignment of the nanostructures 130 above the inner semiconductor region 61 on account of the mechanical stresses that occur.

The further layers 90 and 100 are applied preferably likewise epitaxially. The upper contact layer 110 can be deposited epitaxially or applied in some other way.

For the materials of the layers 30, 50, 60, 70, 80, 90 and 100, the following material parameters are regarded as advantageous:

Layer 30: AlGaAs, Al content between 10% and 30% or between 65% and 80%, alternatively InGaP having an In content of 45% to 52% (but preferably 48%), n-doped, layer thickness between 100 nm and 3000 nm, doping between $5 \times 10^{17}$ cm$^{-3}$ and $5 \times 10^{18}$ cm$^{-3}$, Layer 50: GaAs or AlGaAs, n-doped, layer thickness between 50 nm and 500 nm, doping between $1 \times 10^{14}$ cm$^{-3}$ and $1 \times 10^{17}$ cm$^{-3}$, Layer 60: AlGaAs, Al content preferably 100%, can also contain a composition gradient or composition steps, n-doped, layer thickness between 10 nm and 100 nm, doping between $5 \times 10^{16}$ cm$^{-3}$ and $5 \times 10^{17}$ cm$^{-3}$, Layer 70: GaAs, undoped, layer thickness between 20 nm and 500 nm, Layer 80: InGaAs or InAs, layer thickness between 0.2 nm and 50 nm, undoped, Layer 90: GaAs, undoped, layer thickness between 50 nm and 500 nm, doping between $1 \times 10^{14}$ cm$^{-3}$ and $1 \times 10^{17}$ cm$^{-3}$, Layer 100: AlGaAs, Al content between 10% and 30% or between 65% and 80%, alternatively InGaP having an In content of 45% to 52% (but preferably 48%), p-doped, layer thickness between 100 nm and 3000 nm, doping between $5 \times 10^{17}$ cm$^{-3}$ and $5 \times 10^{18}$ cm$^{-3}$.

The layers are preferably grown epitaxially. Suitable process parameters for a growth method in the gas phase are, for example:

Layer 30: Substrate temperature 700° C., reactor pressure 100 mbar, growth rate 1 μm/h, starting substances trimethylaluminum (TMA), trimethylgallium (TMG), arsine (AsH$_3$), ratio of the partial pressures of AsH$_3$ to TMG and TMA (V/III ratio) >200, Layer 50: Substrate temperature 700° C., reactor pressure 100 mbar, growth rate 1 μm/h, starting substances TMG and AsH$_3$, V/III ratio >100, Layer 60: Substrate temperature 700° C., reactor pressure 100 mbar, growth rate 1 μm/h, starting substances TMG, TMA and AsH$_3$, V/III ratio >200, Layer 70: Substrate temperature 700° C., reactor pressure 100 mbar, growth rate 1 μm/h, starting substances TMG and AsH$_3$, V/III ratio >100, and Layer 90: Substrate temperature 600° C., reactor pressure 100 mbar, growth rate 1 μm/h, starting substances TMG and AsH$_3$, V/III ratio >100.

The epitaxy steps for growing the third intermediate layer 80 and the nanostructures 130 can be implemented for example as follows:

Baking: Substrate temperature 730° C., duration 10 min., AsH$_3$ partial pressure 1 mbar, Layer 80: Substrate temperature 600° C., reactor pressure 100 mbar, growth rate 0.3 μm/h, starting substances TMG and AsH$_3$, V/III ratio >100, and Nanostructures 130: Substrate temperature 500° C., reactor pressure 100 mbar, growth rate 0.1 μm/h, starting substances TMG, trimethylindium and AsH$_3$, V/III ratio >5.

For all the layers, tertiary butylarsenic (TBAs) can be used as an alternative to AsH$_3$. Particularly at lower growth temperatures of 450° C. to 600° C., TBAs can be advantageous on account of its thermal properties (reduced decomposition temperature). The ratio of the partial pressures of TBAs to TMG and TMA (TBAs/III ratio) is preferably between 1 and 40.

The oxidation step for the marginal oxidation of the first intermediate layer 60 can be implemented for example as follows:

Step 1: Photolithographic definition of an etching mask (e.g. composed of photoresist or silicon nitride) of one or more mesa strips having a width of 15-50 μm.

Step 2: Wet-chemical or dry-chemical etching for exposing the lateral strip surfaces.

Step 3: Wet-chemical removal of the etching mask.

Step 4: Oxidation of the layer 70 in a nitrogen/water vapor atmosphere at 350° C. to 450° C., preferably at 420° C., substrate temperature. The reactor pressure is approximately 50 mbar, for example, and the flow rate for nitrogen is 3 liters/min, for example. The oxidation rate is set for example to 0.5 μm/min by corresponding flow of the water vapor.

Step 5: Cleaning of the sample in an oxygen plasma.

FIG. 6 shows an exemplary embodiment of a vertically emitting electro-optical component 200. The component comprises layers 30 to 110 which can be identical, for example, to those of the component 10 in accordance with FIG. 1. However, the layers 30 and 100 can also be replaced in each case by a periodic layer stack comprising e.g. 5-30 times (AlGaAs/GaAs) having layer thicknesses of the individual layers of between e.g. 30-120 nm, in order to produce a vertically reflective resonator structure.

In contrast to the component 10, in the case of the component 200, a mesa structure 210 is etched instead of a ridge, the cross section of the mesa structure (viewed from above) being round, oval or angular, for example. The cross section is preferably circular, such that a ring-shaped boundary of the layer 61 is produced on account of the oxidation. This supports a uniform distribution of the nanostructures during the growth of the third intermediate layer 80. The etching depth of the mesa structure is once again chosen such that the latter is significantly greater (>1 μm) than the total thickness of the layers applied in subsequent production steps.

The electromagnetic radiation is coupled out along the arrow direction P through an opening 220 in the upper contact layer 110.

FIG. 7 illustrates by way of example the profile of the surface strain V in percent on the surface of the second intermediate layer for two different diameters D of the elevation against the respective position X. It is assumed by way of example that the center of the elevation is situated at X=0 μm. A positive value for the surface strain V in FIG. 7 describes a tensile stress, whereas a negative value describes a compressive stress.

It can be discerned in FIG. 7 that in the case of a large diameter D=2 μm of the elevation the strain is highest in the region of the edges of the elevation and accordingly, during subsequent application of nanostructures, the latter grow exclusively or predominantly in the region of the edges. In the case of a large diameter, therefore, the central region above the elevation remains completely or almost completely free of nanostructures. Exemplary embodiments of components comprising nanostructures in the region of the outer edges of the elevation were explained above in association with FIGS. 1 to 6.

It can furthermore be discerned in FIG. 7 that in the case of a small diameter D=1 μm of the elevation, in contrast, the strain spreads over the entire elevation and is highest in the central region of the elevation, such that during subsequent application of nanostructures the latter are formed particularly in the central region of the elevation. FIGS. 8 and 9 show exemplary embodiments in which the nanostructures lie in the central region of the elevation on account of the small size of the elevation.

FIG. 8 reveals an exemplary embodiment of an edge emitting electro-optical component 10, which is a laser, for example. The nanostructures lie in the central region of the elevation on account of the small size of the elevation E. For the rest, the exemplary embodiment in accordance with FIG. 8 corresponds to the exemplary embodiment in accordance with FIG. 1.

FIG. 9 reveals an exemplary embodiment of a vertically emitting electro-optical component 10, which is a laser, for example. The nanostructures lie in the central region of the elevation on account of the small size of the elevation E. For the rest, the exemplary embodiment in accordance with FIG. 9 corresponds to the exemplary embodiment in accordance with FIG. 6.

LIST OF REFERENCE SIGNS

10 Edge emitting component
20 Substrate
30 Lower waveguide cladding layer
40 Waveguide core
50 Lower waveguide core layer
60 First intermediate layer
61 Inner semiconductor region
62 Oxidized layer region
70 Second intermediate layer
80 Third intermediate layer
90 Upper waveguide core layer
100 Upper waveguide cladding layer
110 Upper contact layer
120 Ellipse/fundamental mode
130 Nanostructure
200 Vertically emitting component
210 Mesa structure
220 Opening
D Diameter
E Elevation
R Ridge
R1,R2 Edge/Margin
P Arrow

The invention claimed is:

1. A method for producing an electro-optical component (10, 200) suitable for emitting electromagnetic radiation (120), wherein in the method
 a first intermediate layer (60) is applied on a carrier,
 a second intermediate layer (70) is applied on the first intermediate layer, and
 after the second intermediate layer has been applied, a mesa or ridge structure is etched and the buried first intermediate layer is locally modified laterally from the outside of the mesa or ridge structure,
 wherein as a result of the local modification of the buried first intermediate layer in a lateral direction a refractive index jump is produced which brings about a lateral wave guiding of the electromagnetic radiation (120) in the unmodified region of the first intermediate layer,
 wherein the local modification of the first intermediate layer (60) causes a strain both in the first intermediate layer (60) and in the second intermediate layer (70) situated thereabove and forms an elevation (E) in the region above an inner semiconductor region (61) of the first intermediate layer (60) and
 wherein, after etching the mesa or ridge structure, a third intermediate layer (80) is applied to the second intermediate layer, wherein nanostructures (130) are formed on the second intermediate layer as a result of the strain in the first and second intermediate layers in the region of the outer edges of the elevation (E), due to the strain caused previously in the region of the outer edges of the elevation (E).

2. The method as claimed in claim 1, wherein the lateral diameter of the elevation (E) is greater than 1.5μm and preferably lies between 1.5 μm and 2.5μm.

3. The method as claimed in claim 1, wherein the nanostructures (130) are formed on the second intermediate layer (70) in the central region of the elevation (E), due to the strain caused previously in the central region of the elevation (E).

4. The method as claimed in claim 3, wherein the lateral diameter of the elevation (E) is a maximum of 1.5 μm.

5. The method as claimed in claim 1, wherein the third intermediate layer (80) forms the active zone in which radiation is generated.

6. The method as claimed in claim 1, wherein quantum dots or quantum films are formed as nanostructures (130).

7. The method as claimed in claim 1, wherein as a result of the local modification of the buried first intermediate layer (60) in a lateral direction a refractive index jump is produced symmetrically about an optical axis of the component and the lateral waveguiding is effected symmetrically with respect to the optical axis.

8. The method as claimed in claim 1, wherein the third intermediate layer (80) is grown epitaxially on the second intermediate layer (70) after the local modification of the first intermediate layer (60).

9. The method as claimed in claim 1, wherein a mechanical strain is locally induced in the second intermediate layer (70) and the third intermediate layer (80) as a result of the local modification of the first intermediate layer (60), said mechanical strain supporting or causing the formation of nanostructures (130) during the deposition of the third intermediate layer (80).

10. The method as claimed in claim 1, wherein
 a section of the second intermediate layer (70) is removed and
 the buried first intermediate layer (60) is exposed at least in sections and the intermediate layer exposed at least in sections is chemically modified before the third intermediate layer (80) is grown epitaxially on the second intermediate layer (70).

11. The method as claimed in claim 10, wherein the chemically modified section (62) of the first intermediate layer (60) is electrically nonconductive and has a lower refractive index than the unmodified section (61) of the buried first intermediate layer.

12. The method as claimed in claim 1, wherein
 the electro-optical component is laterally monomodal or laterally multimodal with regard to the emitted electromagnetic radiation, and
 the lateral mode or the lateral modes of the electromagnetic radiation is/are defined by the lateral waveguiding of the unmodified region (61) of the buried first intermediate layer (60).

13. The method as claimed in claim 1 wherein the electromagnetic radiation is generated exclusively or predominantly in that region of the third intermediate layer (80) which is situated above the unmodified section (61) of the first intermediate layer (60).

\* \* \* \* \*